United States Patent [19]

Long et al.

[11] Patent Number: 4,481,662
[45] Date of Patent: Nov. 6, 1984

[54] METHOD AND APPARATUS FOR OPERATING A LOUDSPEAKER BELOW RESONANT FREQUENCY

[76] Inventors: Edward M. Long, 4107 Oakmore Rd., Oakland, Calif. 94602; Ronald J. Wickersham, 694 Mountain View Ave., Santa Rosa, Calif. 95401

[21] Appl. No.: 337,787

[22] Filed: Jan. 7, 1982

[51] Int. Cl.³ .............................................. H03G 5/00
[52] U.S. Cl. ..................... 381/98; 381/103; 333/28 T
[58] Field of Search .............. 179/1 D, 1 A, 1 B, 1 F; 333/28 R, 28 T; 328/127, 167; 330/149, 278, 310; 381/98–103, 120, 121, 104–109, 117

[56] References Cited

U.S. PATENT DOCUMENTS 3,715,501 2/1973 Russell ................................ 179/1 D
3,988,541 10/1976 Boast .................................. 179/1 D
4,118,600 10/1978 Stahl .................................. 179/1 D Primary Examiner—Gene Z. Rubinson
Assistant Examiner—W. J. Brady
Attorney, Agent, or Firm—Manfred M. Warren; Robert B. Chickering; Glen R. Grunewald

[57] ABSTRACT

A method for processing the audio signal in a loudspeaker system prior to delivery to the loudspeaker and the apparatus for such processing is disclosed. Uniform acoustic output with respect to frequency at frequencies below the resonant frequency of the loudspeaker system is achieved by changing the strength of the signal at a constant rate in inverse proportion to audio signal frequencies from a frequency below the resonant frequency to a frequency at least one octave above the resonant frequency. A method and apparatus for limiting the audio signal to prevent distortion is also disclosed.

15 Claims, 4 Drawing Figures

METHOD AND APPARATUS FOR OPERATING A LOUDSPEAKER BELOW RESONANT FREQUENCY

BACKGROUND OF THE INVENTION

1. Field of Invention

The invention relates to the processing of audio signals which are used to drive loudspeakers.

2. Description of the Prior Art

The simplest and most conventional approach to loudspeaker design starts with a single full range driver, most often in the four- to eight-inch diameter range. This type of single drive design cannot produce high fidelity sound, however, since higher frequencies (above approximately eight KHz) are attenuated due to a combination of cone losses, voice coil inductance defects, and other factors. The aforementioned single driver system will exhibit undesired "beaming" of high frequencies due to the narrowness of a radiation pattern. The fundamental resonance of the system is determined by the physical parameters of the driver and the box and usually will be found somewhere between 60 and 200 Hz. Below fundamental resonance the output of the loudspeaker will fall at the rate of 12 dB per octave for a closed box and 18 dB per octave for a ported or drone cone arrangement. The design approach to solve both the high and low frequency problems associated with the single full range driver system is to add additional drivers, smaller drivers for the high frequencies and larger drivers for the low frequencies. Cross-over circuits are employed to restrict the driver signals to frequencies within the operating range of the drivers. Conventional practice usually leads to a boxed 12- to 15-inch driver for the low frequencies with a combination of the driver and box exhibiting a fundamental resonance somewhere between 30 and 60 Hz.

During the past decade, considerable attention has been given to improving the low frequency response of speakers with a view towards extending the response below that which can be obtained with the common unequalized voltage driven closed box. Serious techniques used, however, extend the bass response about 1 octave, at the most, below which the response falls off at a rate of 24 to 30 decibels per octave with accordingly large phase shifts. It is now well recognized that these phase shifts are as detrimental to accurate sound reproduction as are frequency response anomalies.

Another approach to enhanced low frequency performance uses sub-woofer units which cross-over below 100 Hz. These sub-woofer units are very high priced. They are physically large boxes enclosing high-mass drivers, a combination of which is used to move the fundamental resonance as low as possible. The sub-woofer itself employs no unusual techniques, but rather embodies a very direct approach to extending low frequency response by lowering fundamental resonance.

The previously described prior art speaker systems operate primarily above fundamental resonance. Attempts have been made to extend response well below resonance by the use of a closed loop feedback scheme. Commercial embodiments of this scheme use an accelerometer mounted on the speaker cone. The output from the accelerometer is processed to produce a displacement scaled signal which is then compared to the speaker input signal. The resulting error signal is used as negative feedback to the power amplifier for reducing distortion. There are a number of inherent difficulties associated with this scheme since distortion will produce ambiguities and confusion in the drive displacement signal. It is imperative that a feedback scheme use a directly scaled displacement transducer.

A still further approach found in the prior art is the use of a special amplifier employing techniques associated with the use of negative output resistance. In the simple case, negative output resistance can be used to cancel the effects of finite voice coil resistance. In the more complex case, the imposition of a suite of conjugate impedances can be used to nullify the deleterious affects of mechanical and acoustic compedances of the system. While this technique is perhaps the most complete available, it is by necessity very expensive and difficult to implement.

With the exception of the aforementioned accelerometer scheme, none of the prior art devices extend the low frequency response of loudspeaker systems more than an insignificant amount below fundamental resonance. The range below fundamental resonance can be viewed, in some respects, as an uncharted region into which successful audio forays are rarely made without sophisticated and expensive equipment.

SUMMARY OF THE INVENTION

An object of the present invention is to provide a simple and inexpensive means for operating a loudspeaker system below fundamental resonance. In the past, the fundamental resonant frequency $F_r$ has been viewed as the lower limit below which accurate sound reproduction was difficult or economically impossible to obtain. $F_r$ is determined by the combination of speaker driver parameters and the internal volume of the box which encloses the driver. $F_c$ is the normal high frequency cut-off point of a loudspeaker system, the point at which the response falls to 3 dB. Above $F_c$ the response falls off rapidly. $F_c$ is determined normally by the parameters of the loudspeaker driver only and is not dependent on box parameters. The response in the range above $F_r$ is mass controlled and in the range below $F_r$ is stiffness controlled. The rate of roll off in the stiffness controlled range below $F_r$ is mainly determined by the type of baffle. For a closed box system, the rate of decrease in output below $F_r$ is 12 dB per octave, and the usable speaker output range is generally thought of as the range above $F_r$ and below $F_c$.

The conventional method of compensating for the decrease in acoustical output below $F_r$ is extending the uniform output to some frequency below $F_r$ by increasing the electrical input to the system by means of a bass boost equalizer ahead of the amplifier which drives the system. A separate roll-off filter is used to cause a decrease in acoustical output with increasing frequency, usually at some point well below $F_c$ but above $F_r$ in order to effect a smooth transition between the bass system and the upper range system with which it is to be used.

In our invention, the loudspeaker system resonance $F_r$ determines the upper frequency cutoff point, above which the final acoustical output of the speaker will be decreasing with increasing frequency. In the instant invention, the audio signal is processed to provide reciprocal compensation for the decrease in acoustical output below $F_r$ so that the resultant speaker output is uniform with frequency below $F_r$. The rate of decrease in acoustical output for decreasing frequency is 12 dB per octave for a closed box loudspeaker system. The instant invention processes the audio signal to provide an increase of 12 dB per octave with decreasing frequency so as to provide exact compensation and cause a uniform acoustical output below $F_r$. A double integrating circuit provides exactly the right amount of compensation to obtain a uniform acoustical output below $F_r$ and also provides some inherent benefits in the region above $F_r$. In the region above $F_r$, where the acoustical output of the conventional loudspeaker system is uniform with frequency, our double integrator will provide a decrease in output with increasing frequency of 12 dB per octave. Above $F_c$, where the acoustical output of the conventional system decreases naturally, our double integrator will cause an even greater rate of decrease. The instant invention provides, therefore, a very simple means for obtaining uniform speaker output below fundamental resonance. The highest frequency for which uniform output can be obtained with the apparatus of this invention is determined by the loudspeaker driver and box parameters.

While a double integrator provides the right composition for a closed box system, the characteristics of a vented box system call for the use of a triple integrator to provide uniform acoustic output below $F_r$. Similarly, an unenclosed system will require the use of a quadruple integrator to produce the same results.

The present invention can be easily implemented through the use of inexpensive operational amplifiers installed ahead of a power amplifier. Alternatively, power amplifiers can be designed with the appropriate circuitry of this invention as an integral part. Various means for accomplishing the electrical equivalent of integration, such as differentiating a signal and subtracting the differential from the signal itself to provide the equivalent of one step of integration may be employed as well as piece-wise approximation techniques which employ a multiplicity of RC networks. These and other means of accomplishing the equivalent of integration are well known in the art and can be used to practice a method and apparatus of this invention.

The invention possesses other objects and features of advantage, some of which of the foregoing will be set forth in the following description of the preferred form of the invention which is illustrated in the drawings accompanying and forming part of this specification. It is to be understood, however, that variations in the showing made by the said drawings and description may be adopted within the scope of the invention as set forth in the claims.

DETAILED DESCRIPTION OF THE INVENTION

Figure 2:
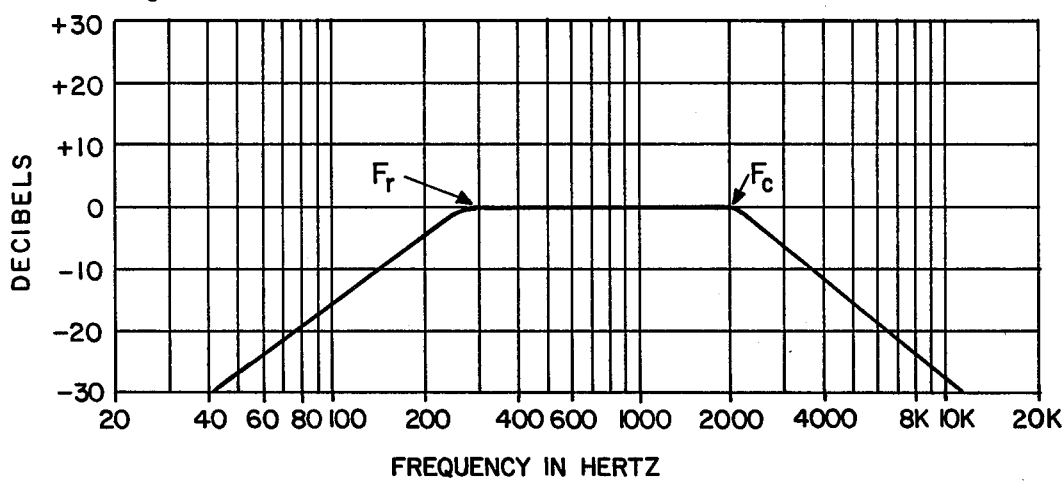
FIG. 2 is a graph showing the acoustical output of a loudspeaker driver in an enclosed box.

The method and apparatus of the present invention involves processing an audio signal prior to delivering the signal to a loudspeaker in order to provide a substantially uniform acoustic output with respect to frequency from the loudspeaker system at frequencies below $F_r$, where $F_r$ is the resonant frequency of the loudspeaker system. FIG. 2 is a graph of output versus frequency which shows the acoustical output of a loudspeaker driver in an enclosed box. $F_r$ is the system resonance frequency which is determined by the combination of loudspeaker driver and box parameters. $F_c$ is the high frequency cut-off determined by the loudspeaker driver parameters only. FIG. 2 shows gain versus frequency curves for the particular embodiment of the invention which is used for processing audio signals for use in closed box loudspeaker systems. The rate of increase in output versus decreasing frequency is 12 dB per octave. The difference between curves A, B, and C are due to gain differences only. These gain versus frequency curves are characteristic of a double integrating amplifier set at three different gain levels to produce the three illustrated curves. Adjustable gain allows the user to match the acoustical output of bass frequencies to match the acoustical output of other loudspeakers which will be used to reproduce the upper frequency ranges.

Figure 3:
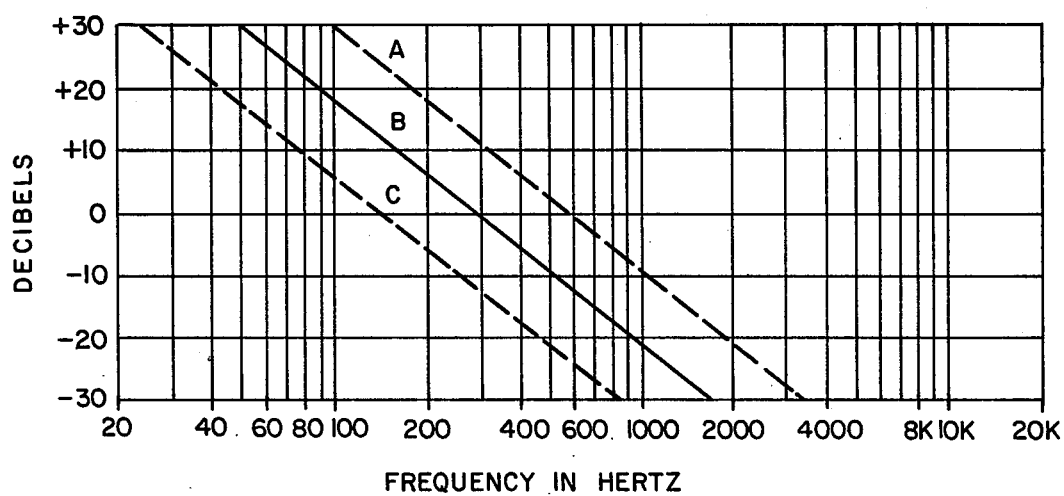
FIG. 3 is a graph illustrating gain versus frequency curves for a double integrating amplifier with limiter.
Figure 4:
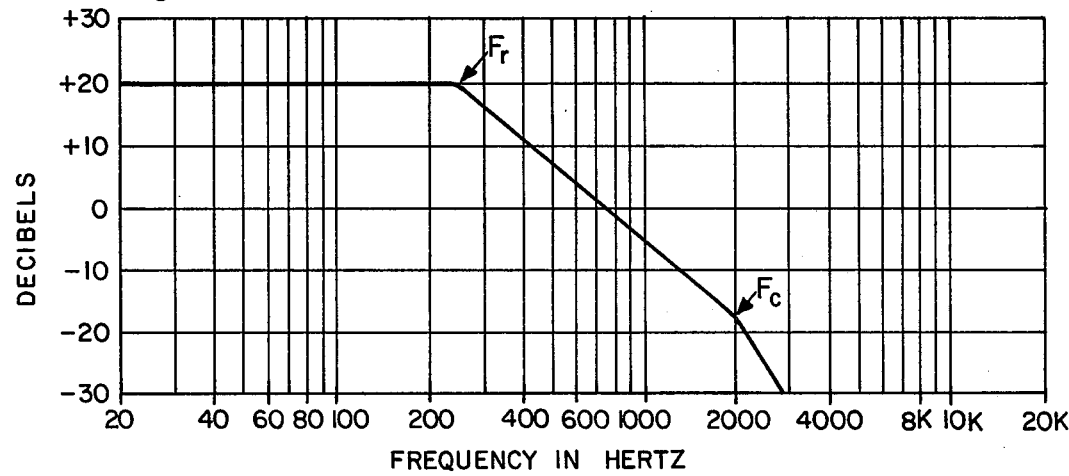
FIG. 4 is a graph showing the acoustical output which can be obtained from a loudspeaker when the instant invention is employed to process the audio signal.

FIG. 4 illustrates the acoustical output of the closed box loudspeaker system when it is driven by an audio signal which has been processed according to the teachings of the instant invention. The method of the instant invention calls for changing the strength of an audio signal at a constant rate in inverse proportion to the audio signal frequencies. The curves in FIG. 3 illustrate this type of signal processing where the rate is 12 decibels per octave. It will be seen from examining the curves in FIG. 3 that the rate is held constant over a wide range of frequencies from below $F_r$ to at least and usually well beyond one octave above $F_r$. When a double integration is performed on an audio signal, the aforementioned 12 dB rate is obtained. FIG. 4 illustrates the acoustical output which is obtained from a closed box load speaker having a resonant frequency $F_r$ when the instant invention is employed to change the strength of the audio signal at a constant rate of 12 dB per octave in inverse proportion to audio signal frequencies. It can be seen from examining FIG. 4 that the loudspeaker output is uniform below $F_r$. Above $F_r$ the instant invention causes the normally flat acoustical output of the loudspeaker system between $F_r$ and $F_c$ to decrease with increasing frequency at a rate of 12 dB per octave. Above $F_c$ where the acoustical output of the loudspeaker normally decreases at 12 dB per octave with increasing frequency, the rate of decrease in acoustical output becomes 24 dB per octave due to the 12 dB per octave rate of decrease of the instant invention.

The use of integrators to perform the method of the instant invention produces very desirable phase characteristics which are uniform and linear with frequency due to the fact that the rate of integration is uniform with respect to frequency. Additionally there is no phase delay added to the normal phase delay of the loudspeaker driver associated with its upper frequency cut-off $F_c$. Our invention, therefore, allows $F_r$ to be at a much lower frequency than the upper frequency point $F_c$ without causing an increase in phase delay.

While it is expected that the widest use of the instant invention will be in connection with closed box loudspeaker systems thus employing an aforementioned rate of 12 decibels per octave which can be produced by double integration, rates of 18 dB per octave are appropriate for use with vented box loudspeaker systems and rates of 24 dB per octave are appropriate for use with unenclosed loudspeaker systems. Triple integration can be used to provide the 18 dB rate and quadruple integration will provide the aforementioned 24 dB rate.

Figure 1:
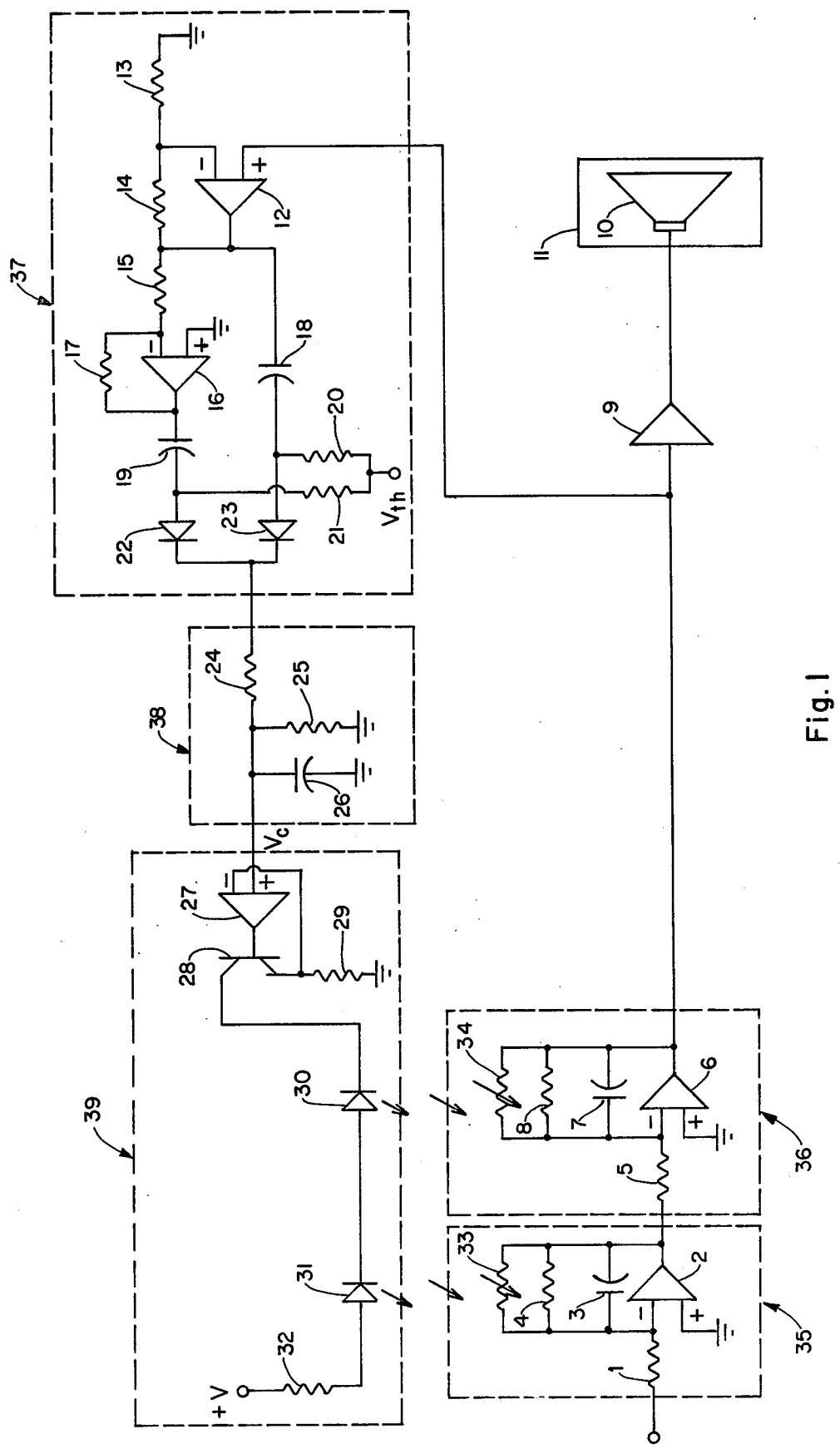
FIG. 1 is a schematic diagram of an embodiment of the invention configured for use with a closed box speaker system.

FIG. 1 is a schematic diagram of an embodiment of the present invention suitable for use with an enclosed box loudspeaker system. In the simplest terms, the apparatus illustrated in FIG. 1 employs two integrators 35 and 36 which are connected between the audio signal and the loudspeaker 10 mounted in closed box 11. The aforementioned double integrator circuit has an amplitude versus frequency response inversely proportional to audio signal frequencies from a frequency $F_1$ lying below $F_r$ to a frequency $F_2$ lying at least one octave above $F_r$. The double integrator has a response slope of 12 dB per octave. A power amplifier 9 is shown in FIG. 1 for increasing the output obtained in the second integrator to a level high enough for satisfactory loudspeaker operation.

Looking now to the internal details of the aforementioned integrators, it can be seen that they are operational amplifiers configured as integrators. The first integrator 35 employs an op. amp. 2 which receives the audio signal through input resistor 1. Integrating capacitor 3 is connected between the output and input of op. amp. 2 and has shunt resistor 4 connected in parallel. Shunt resistor 4 is used to set the quiescent value of $F_1$.

Similarly, integrator 36 employs op. amp. 6 which receives the output of integrator 35 through input resistor 5. Integrating capacitor 7 is connected between the input and output of op. amp. 6 and has a shunt resistor 8 connected in parallel. Shunt resistor 8 is also used to set the quiescent value of $F_1$.

The additional circuitry illustrated in FIG. 1 is limiter circuitry which is employed to prevent distortion. This limiter operates according to the method of varying $F_1$ as shown in FIG. 3 and FIG. 4 upwards from its normal value in response to audio signals which exceed amplitudes which are known to cause distortion. As shown in FIG. 1, a circuit comprises a series of two integrators 35 and 36 each having an integrating capacitor 3 and 7 respectively. Controllable variable resistors 33 and 34 are shunted across capacitors 3 and 7 and are controlled by the output of the last integrator 36 to vary resistance in direct proportion to the output of the last integrator so as to move $F_1$ upwards from its normal value in response to audio signals which exceed amplitudes known to cause distortion. 37 is a full wave rectifier which is biased off by $V_{th}$ so that small signals below levels known to cause distortion will not cause variations in the resistors 33 and 34 which would cause $F_1$ to move upwards. In FIG. 1 the variable resistors are actually photoconductive cells which are controlled by light-emitting diodes 31 and 30. Full wave rectifier 37 employs op. amp. 12 which is configured as a non-inverting amplifier. Resistor 13 is a gain setting resistor which, in combination with feedback resistor 14, sets the gain of the amplifier equal to $1+R_{14}/R_{13}$. 15 is an input resistor having a value equal to feedback resistor 17. 16 is an op. amp. configured as a unity gain inverting amplifier whose gain is equal to negative 1. 18 and 19 are coupling capacitors. 20 and 21 are resistors used to bias diodes 23 and 22 respectively. $V_{th}$ is a threshold voltage which is applied to the biasing resistors 20 and 21 so that rectification is biased off for signals below levels which are known to cause distortion. $V_{th}$ can be varied in different applications to ensure that the limiter will operate only where it is needed to prevent distortion and will not alter $F_1$ unneccessarily. 38 is a control voltage processor which smoothes the output from 37. Control voltage processor 38 uses charging resistor 24 to control attack time. Release time is controlled by discharging resistor 25. Averaging capacitor 26 stores control voltage $V_c$. $V_c$ is at zero when there are no signals requiring limiting. As $V_c$ changes in a positive direction due to signal conditions which activate the limiter, $F_1$ is raised an appropriate amount. This is accomplished by controllable variable resistors 33 and 34 which are responsive to light-emitting diodes 31 and 30. 39 is a circuit for driving the aforementioned light-emitting diodes. 27 is an op. amp. configured together with transistor 28 and resistor 29 to form a voltage to current converter. The collector of transistor 28 is connected to light-emitting diodes 31 and 30 which are in series. The plus is a power source for light-emitting diodes 31 and 30 and is supplied to the diodes through current limiting resistor 32.

$F_2$ can be viewed as the upper frequency limit of integration. This limit in practical applications of the instant invention is always more than 1 octave above $F_r$ and is usually much higher, limited only by the upper frequency limit of the operational amplifiers employed in the integration circuits.

What is claimed is:

1. In a loudspeaker system having a resonant frequency $F_r$, a method for processing an audio signal prior to delivering the signal to the loudspeaker to provide a substantially uniform acoustic output with respect to frequency from said loudspeaker system at frequencies below $F_r$ comprising:
    processing said audio signal by changing the strength of said signal at a constant rate in inverse proportion to audio signal frequencies from a frequency $F_1$ lying below $F_r$ to a frequency $F_2$ at least one octave above $F_r$ by integrating said audio signal twice.

2. The method of claim 1 wherein said loudspeaker system is a closed box system and said rate is 12 dB per octave.

3. The method of claim 1 wherein said loudspeaker system is a vented box system and said rate is 18 dB per octave.

4. The method of claim 3 wherein said processing comprises integrating said audio signal three times.

5. The method of claim 1 wherein said loudspeaker system is an unenclosed system and said rate is 24 dB per octave.

6. The method of claim 5 wherein said processing comprises integrating said audio signal four times.

7. The method of claim 1 further comprising the process of preventing distortion by varying $F_1$ upwards from its normal value in response to audio signal which exceed amplitudes known to cause distortion.

8. In a loudspeaker system having a resonant frequency $F_r$, an apparatus for processing an audio signal prior to delivery to the loudspeaker system to provide a substantially uniform acoustic output with respect to frequency from said loudspeaker system at frequencies below $F_r$ comprising:
    a circuit having at least two integrators in series, the circuit being connected between said audio signal and said loudspeaker system;
    said circuit having an amplitude versus frequency response inversely proportional to audio signal frequencies from a frequency $F_1$ lying below $F_r$ to a frequency $F_2$ lying at least one octave above $F_r$.

9. The apparatus of claim 8 wherein said loudspeaker system is a closed box system and said response has a slope of 12 dB per octave.

10. The apparatus of claim 8 wherein said loudspeaker system is a vented box system and said response has a slope of 18 dB per octave.

11. The apparatus of claim 10 wherein said circuit comprises three integrators in series.

12. The apparatus of claim 8 wherein said loudspeaker system is an unenclosed system and said response has a slope of 24 dB per octave.

13. The apparatus of claim 12 wherein said circuit comprises four integrators in series.

14. The apparatus of claim 8 further comprising a limiter for preventing distortion, and
    said limiter having means for varying $F_1$ upwards from its normal value in response to audio signals which exceed amplitudes known to cause distortion.

15. The apparatus of claim 14 wherein said circuit comprises a series of at least two integrators each with an integrating capacitor; said means being controllable variable resistors, one resistor shunted across each integrating capacitor, said variable resistors being controlled to vary resistance in direct proportion to the output of the last integrator.

* * * * *